United States Patent [19]

Troscinski

[11] Patent Number: 4,628,219
[45] Date of Patent: Dec. 9, 1986

[54] RECTIFIER ASSEMBLY FOR MOUNTING IN A ROTOR

[75] Inventor: Mark A. Troscinski, Rockford, Ill.

[73] Assignee: Sundstrand Corporation, Rockford, Ill.

[21] Appl. No.: 775,664

[22] Filed: Sep. 13, 1985

[51] Int. Cl.$^4$ .................... H02K 11/00; F02N 25/08
[52] U.S. Cl. ................ 310/68 D; 310/60 R; 357/76; 363/141; 363/145
[58] Field of Search ............ 310/68 R, 68 D, 71, 310/60 R; 357/76; 363/141, 145; 322/28, 87

[56] References Cited

U.S. PATENT DOCUMENTS

| 2,414,287 | 1/1947 | Crever | 171/119 |
|---|---|---|---|
| 2,897,393 | 7/1959 | Barrows et al. | 310/68 |
| 3,307,087 | 2/1967 | Rogers et al. | 357/76 |
| 3,489,959 | 1/1970 | Mahn | 357/76 |
| 3,501,659 | 3/1970 | Pannell | 310/49 R |
| 3,573,569 | 8/1969 | Davis | 357/76 |
| 3,577,002 | 4/1971 | Hall | 310/68 |
| 3,727,114 | 4/1973 | Oshima | 357/76 |
| 3,921,201 | 11/1975 | Eisele et al. | 357/76 |
| 4,347,543 | 8/1982 | Frister et al. | 310/68 D |
| 4,472,649 | 9/1984 | Namba et al. | 310/68 D |
| 4,494,171 | 1/1985 | Bland et al. | 361/386 |
| 4,523,121 | 6/1985 | Takahashi et al. | 310/338 |

FOREIGN PATENT DOCUMENTS

| 1054590 | 4/1959 | Fed. Rep. of Germany | 310/68 R |
| 1914398 | 10/1969 | Fed. Rep. of Germany | 357/76 |
| 1464515 | 5/1973 | Fed. Rep. of Germany | 357/76 |

Primary Examiner—Patrick R. Salce
Assistant Examiner—D. L. Rebsch
Attorney, Agent, or Firm—Wood, Dalton, Phillips, Mason & Rowe

[57] ABSTRACT

Disclosed is an improved rectifier assembly for use in a rotor of a dynamo electric machine which includes a tubular housing receiving a stack of plates sandwiching diode wafers between studs on certain of the plates and confined by annular ridges on others of the plates. The plates are provided with coolant passages with the coolant passages on adjacent plates being staggered to provide improved impingement cooling.

11 Claims, 5 Drawing Figures

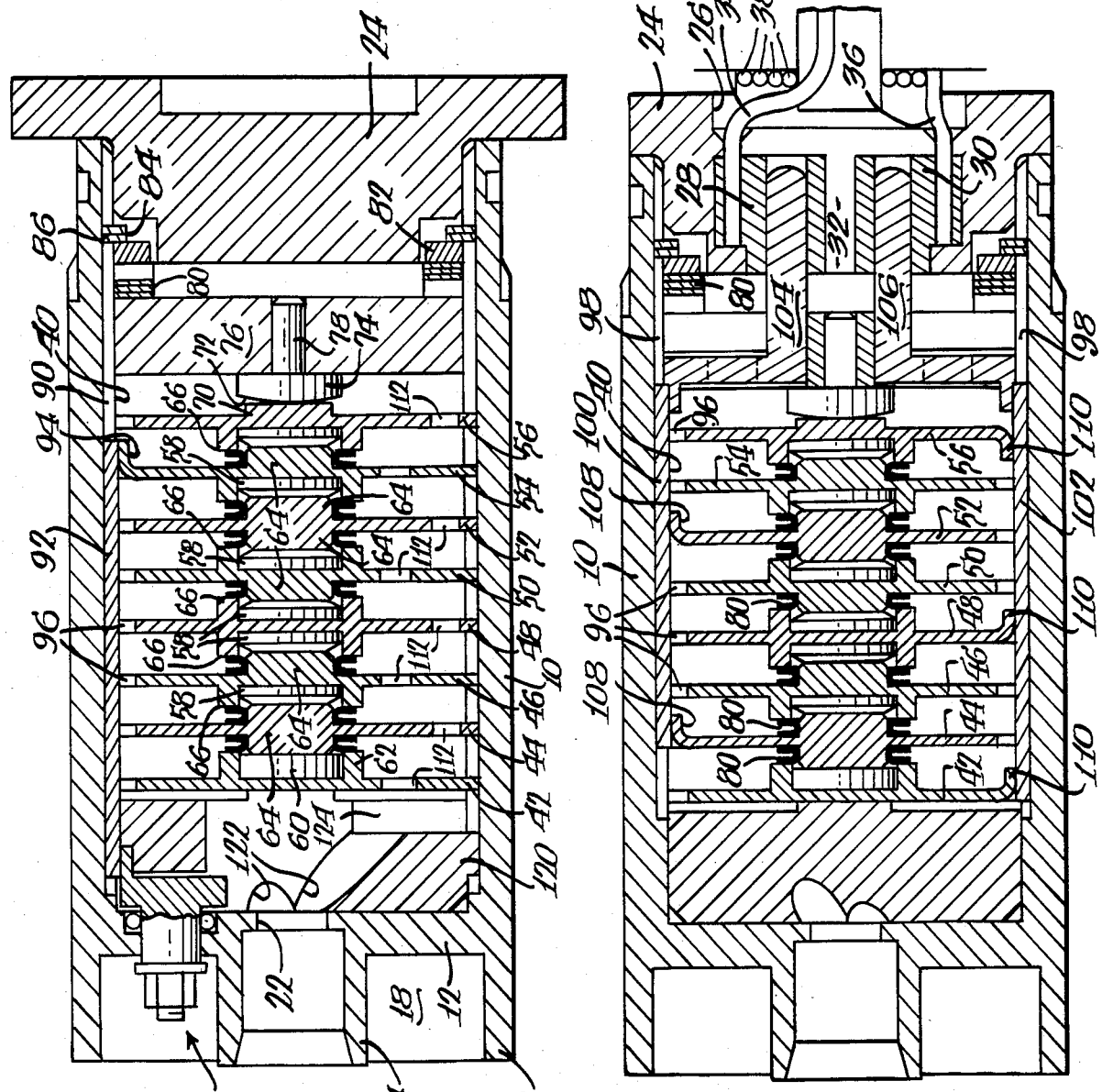

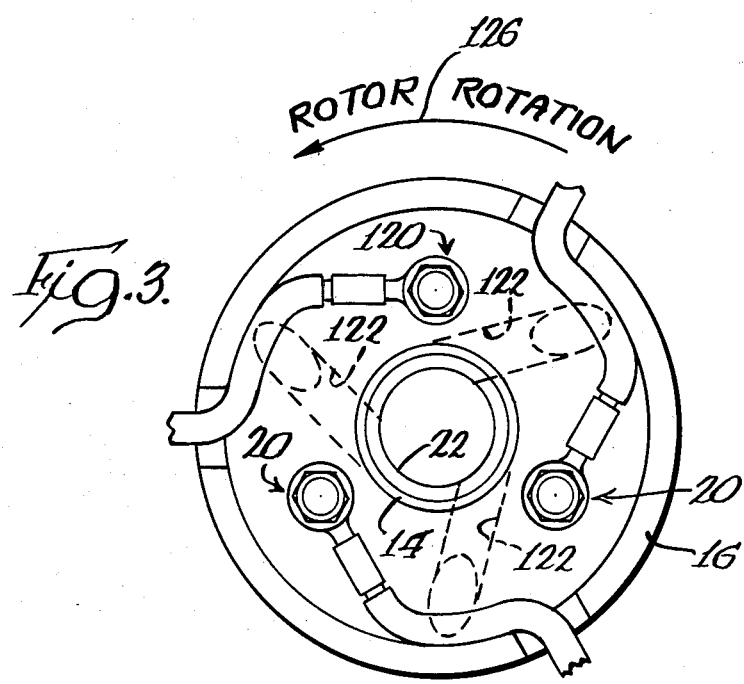
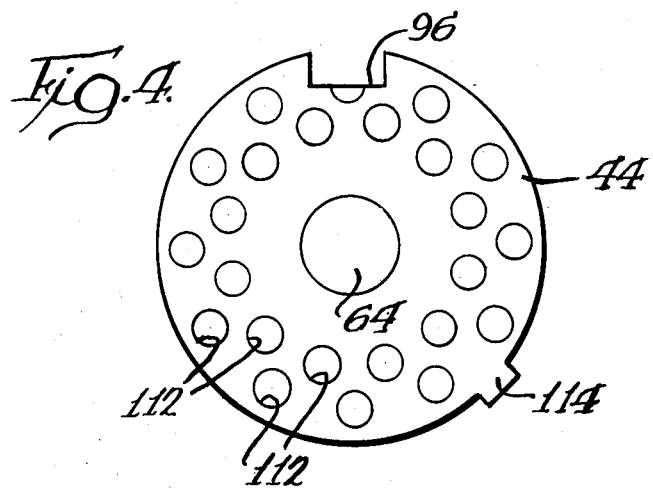
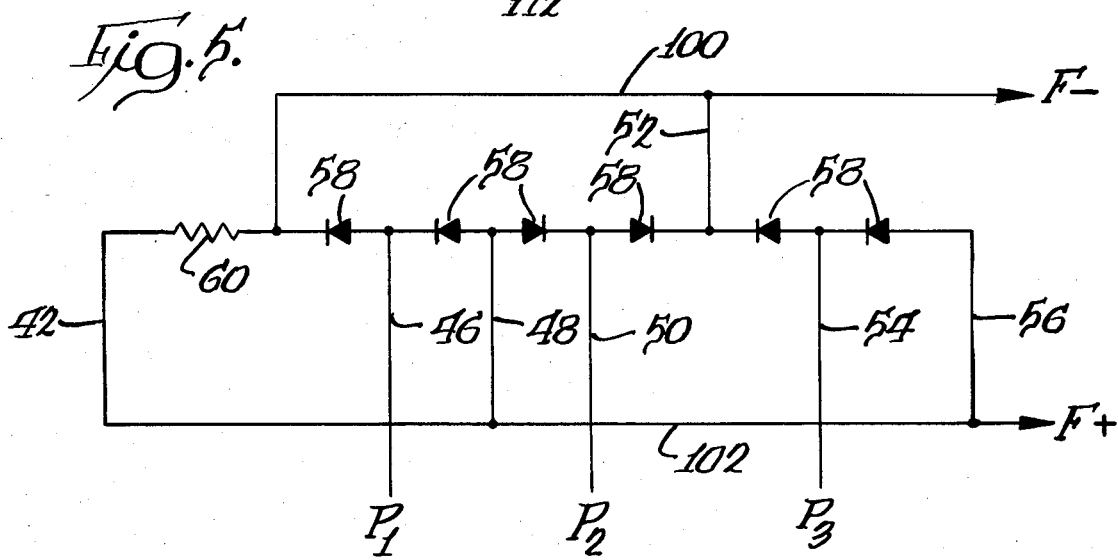

RECTIFIER ASSEMBLY FOR MOUNTING IN A ROTOR

FIELD OF THE INVENTION

This invention relates to a rectifier assembly that is adapted to be disposed in a rotor, as for example, a generator rotor and to be rotated at high speed therewith.

BACKGROUND OF THE INVENTION

In many generators, such as high speed generators utilized in aircraft, it is highly desirable to eliminate brushes since they frequently require maintenance and/or replacement, and are perhaps the single weakest point in the system in terms of breakdowns. Moreover, by its very nature, the electrical path between a brush and a commutator is subject to arcing which may introduce transients into the electrical energy being produced, which in turn, may interfere with proper operation of some types of electrical loads on the generator.

A typical brushless generator has three distinct generating systems including a main generator, an exciter, and a permanent magnet generator. The permanent magnet generator includes permanent magnets for establishing a magnetic field which is employed to induce current in a set of windings, which in turn is employed after rectification to generate a magnetic field in the exciter. The magnetic field in the exciter, is in turn, employed to induce an even higher level of current, typically three-phase alternating current, which is then employed to generate the magnetic field for the main generator by flowing the current through the main field winding of the generator system.

In order to avoid the use of brushes, it is necessary that the magnetic field in the main generator be in the rotor so that the output of the system can be taken from the stator of the main generator. In order to generate a suitable magnetic field in the rotor, it is necessary to utilize direct current, as opposed to alternating current, for the same. Since the output of the exciter is an alternating current, this current must be rectified to direct current. And, again, in order to avoid resort to brushes, it is accordingly necessary that the rectifier interconnecting the exciter in the main generator field winding be carried by the rotor of the generator. The U.S. Pat. No. 3,577,002 issued May 4, 1971 to Hall et al, is generally illustrative of this approach although it does show a commutator and brush structure which is necessary for alternative use of the generating system as a starter motor. The same approach is also illustrated in U.S. Pat. No. 4,139,789 issued Feb. 13, 1979 to Hunt. Furthermore, an example of a rotating rectifier assembly specifically intended for use in such systems is illustrated in the commonly assigned application of Trommer, application Ser. No. 635,511 filed July 30, 1984 now U.S. Pat. No. 4,603,344, and entitled "Rotating Rectifier Assembly".

In any event, because the rectifier assembly is carried by the rotating shaft of the generating system, it is subjected to high centrifugal loading and much care must be taken to assure that the components of the rectifier are adequately supported against such forces. It will also be appreciated that it is highly desirable to minimize the space occupied by the rectifier assembly since it is typically housed within the rotor shaft itself. Finally, it is desirable to make provision for cooling the rectifier assembly during operation since such not only minimizes the possibility of thermal damage to the components, but provides a greater capacity over correspondingly sized, uncooled rectifier assembly.

It is also desirable that the assembly be such that it may be easily removed for servicing in the event of component failure.

The present invention is, therefore, directed to the provision of a semiconductor assembly, typically a rectifier assembly, having the foregoing attributes.

SUMMARY OF THE INVENTION

It is the principal object of the invention to provide a new and improved semiconductor assembly. More specifically, it is the object of the invention to provide a new and improved rotating rectifier assembly adapted for high speed rotation.

The foregoing objects, according to one facet of the invention, are achieved in a rectifier assembly including a generally tubular housing. A stack of relatively thin plates formed of thermally and electrically conductive material is disposed within the housing. At least one face of some of the plates includes an axially directed annular ridge centrally of the face to define a recess. In addition, at least another face of some of the plates has a central, axially projecting stud aligned with a recess in the adjacent face of an adjacent plate. A diode wafer is disposed within each such recess and means are provided for applying a compressive pressure to the stack to bring the plates, studs, and wafers into good thermal and electrical contact. Electrical conductors extend through the stack and are in electrical contact with predetermined ones of the plates and are electrically isolated from predetermined others of the plates. Means are provided for flowing a coolant through the housing including non-aligned apertures in the plates.

Preferably, the housing is can-like and includes an opening through which the stack may be introduced. A closure is provided for the opening and the compressive pressure applying means includes compressed spring means interposed between the closure and an end-most one of the plates in the stack.

In a preferred embodiment, the spring means comprises at least one wavy spring with a ring abutting the spring oppositely of the stack. A lock ring is received in an interior groove in the housing and prevents movement of the ring to the opening.

The preferred embodiment of the invention includes an additional plate at the end of the stack and which has a central annular ridge defining an additional recess facing the other plates in the stack. A disc-like resistor is disposed in the additional recess and is in electrical contact with the additional plate and the adjacent plate in the stack.

Annular seals may be fitted about each of the studs in sealing engagement with the associated stud and an adjacent annular ridge.

According to another facet of the invention, there is provided a generally tubular housing having an interior and a series of plates formed of thermally and electrically conductive material are disposed within the housing in substantial abutment with the interior to form an aligned stack of such plates. Various faces of the plates include recesses or studs as mentioned previously, and the recesses receive semiconductor wafers. A compressive pressure applying means is likewise provided. Electrical bus bars slidably extend through the stack around the periphery thereof and are in electrical contact with predetermined ones of the plates and electrically isolated from others of the plates.

In the preferred embodiment, the bus bars are located in angularly spaced, axially extending, radially inwardly opening grooves in the tubular housing.

According to another facet of the invention, there is provided a tubular housing having an interior and a series of plates formed of thermally and electrically conductive material are located within the housing in substantial abutment with the interior to form an aligned stack of plates. The faces of the plates are configured to define diode receiving pockets and a diode wafer is disposed within each such pocket. Compressive pressure applying means as before are employed and electrical conductors extend axially through the stack in electrical contact with various ones of the elements. Means are provided for introducing coolant into the housing generally on the intended rotational axis of the rotor in which the assembly may be received and include a plurality of passages generally tangential to the axis and extending radially outwardly thereof oppositely of the intended direction of rotation about such axis.

Other objects and advantages will become apparent from the following specification taken in connection with the accompanying drawings.

DESCRIPTION OF THE DRAWINGS

FIG. 1 is a sectional view of a rotating rectifier assembly made according to the invention and illustrates a typical connector whereby the assembly may be electrically connected to one phase output of an excitor;

FIG. 2 is a sectional view similar to FIG. 1 but taken at a different angle to show the means by which the assembly may be connected to the main field winding of an electrical generator;

FIG. 3 is an end view of the assembly;

FIG. 4 illustrates a typical plate that may be used in the assembly; and

FIG. 5 is an electrical schematic of the rectifier assembly.

DESCRIPTION OF THE PREFERRED EMBODIMENT

An exemplary embodiment of a rotating rectifier assembly made according to the invention is illustrated in the drawings and with reference to FIGS. 1 and 2, is seen to include a generally tubular housing 10 closed at one end by a web 12. Radially inner and outer, axially extending annular flanges 14 and 16 define an annular space 18 in which input terminals 20 may be disposed. The web 12, centrally of the flange 14 is provided with a bore 22 which together with the flange 14 serves as a coolant inlet.

At the end of the housing 10 opposite the web 12 is a removable closure 24. As best seen in FIG. 2, the closure 24 is provided with a recess 26 which receives spaced, electrically isolated female electrical terminals 28 and 30. A space 32 between the terminals 28 and 30 serves as a coolant outlet from the housing 10. Electrical leads 34 and 36 are respectively connected to the terminals 28 and 30 and extend axially to connect with a generator main field winding, elements of which are shown at 38, when the assembly is utilized in a brushless generator as alluded to previously.

Being tubular, the housing 10 has an interior cavity 40 which serves to house rectifier components. Within the cavity 40 are eight, generally circular, relatively thin plates 42, 44, 46, 48, 50, 52, 54 and 56 which are formed of a material that is a good thermal and electric conductor. The plates 42–56 are aligned with each other to form a stack, and the plates 44–56 sandwich a total of six diode wafers 58, that is, diodes without their customary packaging, including terminals. The plates 42 and 44 sandwich a disc-like resistor 60.

Centrally of the plate 42, on the side thereof facing the remaining plates 44–56, is an axially projecting, annular ridge 62 which defines a recess for receipt of the resistor 60.

The plate 44, in turn, centrally thereof, has oppositely directed studs 64. The left-most stud 64 contact one side of the resistor 60 while the other side of the resistor 60 is in contact with the base material of which the plate 42 is formed, to place the resistor 60 electrically across the plates 42 and 44.

The right-most stud 64 on the plate 44 engages one electrode of one of the diodes 58 which is in a recess defined by an annular ridge 66 on the left-hand side of the plate 46 and which is similar to the ridge 62. The other electrode of such diode 58 is in contact with the base material of which the plate 46 is formed and thus, is electrically across the plates 44 and 46.

The right-hand side of the plate 46 is provided with a central axially projecting stud 64 engaging a diode 58 received in an annular recess defined by ridge 66 on the plate 48. The plate 48 also includes a ridge 66 on its opposite side to define a recess for receipt of a diode 58 which in turn is engaged by a stud 64 carried by the left-hand face of the plate 50. The ridges 66 and studs 64 are located on the remaining plate 52–56 as illustrated in FIGS. 1 and 2. Finally, the right-hand face of the plate 56 is provided with a central stud 70 engaged by the spherical surface 72 of a button 74 centrally disposed in a spacer 76 by means of post 78.

As can be appreciated from FIGS. 1 and 2, the diameter of the studs 64 is somewhat less than the inner diameter of the ridges 62 so that when the stack of plates 42–56 is assembled, the studs 64 may slightly enter the recesses defined by the ridges 62 and 66 without making electrical contact therewith.

Preferably, though not necessarily, annular seals 80 surround each of the studs 64 and sealingly engage the same as well as the axial end of each of the ridges 62 and 66 to thereby seal the recesses in which the diode wafers 58 and the resistor 60 are received.

To assure that the electrodes of the diode wafers 58 are in good electrical contact with the studs 64 or the bottoms of the recesses defined by the respective ridges 66, a series of annular, wavy springs 80 are compressed against the spacer 76 by a ring 82 just inwardly of the closure 24. The ring 82 is held in place axially by lock rings 84 received in a radially inwardly opening groove 86 on the interior 40 of the housing 10. In this respect, force applied by the wavy spring assembly 80 is uniformly applied to the stack of plates and diode wafers by reason of the spherical surface 72 making essentially point contact with the center of the stud 70.

The interior 40 of the housing 10 is provided with a series of three, equally angularly spaced, axially extending interior grooves 90 (FIG. 1, only one of which is shown). An elongated bus bar 92 is received in each such groove 90 and extends sufficiently along the length thereof as to be placed in electrical contact with one of the plates. As illustrated in FIG. 1, one such bus 92 is in slidable electrical contact with a somewhat resilient tab 94 formed on the plate 54. The bus bar 92 is also in electrical contact with one of the terminals 90. Each such bus bar 92 serves as a phase conductor in a three-phase rectifying system and though not shown, other bus bars will be placed in slidable electrical connections by similar means with the plates 46 and 50. Each of the buses 92 is isolated from the other plates to which it is not to be connected either by a lack of sufficient axial length to extend to all the plates in the stack or by means of notches 96 in the periphery of such plate (see also FIG. 4).

The interior 40 of the housing 10 also has two diametrically opposite, axially extending, radially inwardly opening grooves 98 as illustrated in FIG. 2 which are angularly spaced from the grooves 90. Bus bars 100 and 102 are slidably located in the grooves 98 and are in electrical contact with respective male connectors 104 and 106 which in turn are received in the female connectors 28 and 30. Thus, the bus bars 100 and 102 serve to connect the semiconductor assembly ultimately to the field winding 38 of the rotor in which the rectifier may be used. As can be seen in FIG. 2, the bus bar 100 is in slidable electrical contact with somewhat resilient tabs 108 on the plates 44 and 52 and passes through notches 96 in the others of the plates. The bus bar 102 is likewise in slidable contact with somewhat resilient tabs 110 on the plates 42, 48, and 56.

Turning to FIGS. 1 and 4, each of the plates 42–56 may be provided with a series of apertures or openings 112 which serve to define fluid passages for coolant entering the housing to allow the same to circulate through and between the various plates. Preferably, the holes 112 in adjacent plates are non-aligned as is apparent from FIG. 1 to provide an impingement type of cooling. Specifically, a jet of coolant flowing through an aperture 112 in the plate 42 will impinge upon a solid portion of the adjacent plate 44 and be directed through the holes 112 and the plate 44 to impinge upon solid portions of the plate 46, etc. Such impingement cooling increases the coefficient of heat transfer between the coolant and the plates 42–56, which in turn, serve to conduct heat from the diode wafers 58 and the resistor 60 to be transferred to the coolant.

The size and number of the holes 112 in the various plates 42–56 may be varied throughout the stack to achieve desired cooling characteristics at each semiconductor. This allows the assembly to be "tuned" to any of a variety of heat transfer schemes.

To assure proper alignment of the notches 96 and non-alignment of the apertures 112 in adjacent ones of the plates, as seen in FIG. 4, the periphery of each of the plates may be provided with a radially outwardly extending tab 114 which may be received in still another axial groove (not shown) similar to the grooves 90 and 98 for locating purposes.

Turning now to FIGS. 1, 2 and 3 with special emphasis on the latter, it will be seen that a terminal mounting block 120 for the terminals 20 is received between the web 12 and the plate 42 to mount the terminals 20. The block 120 also includes fluid passages 122 which extend outwardly of the rotational axis of the device from a point whereat they are in fluid communication with the bore 22 serving as the coolant inlet to an annular space 124 immediately adjacent the plate 42 in alignment with the apertures 112 therein so as to deliver coolant thereto. As seen in FIG. 3, the passages 122 communicate with the bore 22 in a generally tangential fashion and extend away therefrom in a direction opposite the intended direction of the rotor rotation shown by an arrow 126. During operation of the machine in which the rectifier is utilized, this configuration results in smooth introduction of the coolant into the housing 10 thereby minimizing the pressure drop of coolant flow through the housing to reduce energy requirements in pumping the coolant.

FIG. 5 is an electrical schematic of the three-phase, full wave rectifier defined by the foregoing components using the same reference numerals given to the structural counterparts in the previously described construction for the purpose of illustrating, without obscuration by mechanical details, the electrical nature of the assembly.

From the foregoing, it will be appreciated that a rotating rectifier assembly made according to the invention, is ideally suited for use in high speed dynamo electric machines. The semiconductors employed are maintained on the rotational axis to minimize stress applied thereto and the assembly incorporates an excellent coolant mean allowing rectifying capacity to be increased to a maximum. The assembly may be easily disassembled for servicing.

The coolant inlet construction minimizes pressure drop to thereby conserve energy as well.

I claim:

1. A rectifier assembly adapted to be mounted in a generator rotor for rotation therewith comprising:
    a generally tubular housing;
    a stack of relatively thin plates formed of thermally and electrically conductive material within said housing;
    at least one face of some of said plates including an axially directed annular ridge centrally of the face and defining a recess;
    at least another face of others some of said plates having a central, axially projecting stud aligned with a recess in the adjacent face of the adjacent plate;
    a diode wafer within each said recess;
    means for applying a compressive pressure to said stack to bring said plates, studs, and wafers into good thermal and electrical contact;
    electrical conductors extending through said stack and in electrical contact with predetermined ones of said elements and electrically isolated from predetermined others of said elements; and
    means for flowing a coolant through said housing including non-aligned apertures in said plates.

2. The rectifier assembly of claim 1 wherein said housing is can-like and includes an opening through which said stack may be introduced; a closure for said opening; and said applying means comprising a compressed spring means interposed between said closure and an end-most one of said elements in said stack.

3. The rectifier assembly of claim 2 wherein said spring means comprises at least one wavy spring, a ring abutting said spring oppositely of said stack and a lock ring received in an interior groove in said housing preventing movement of said ring to said opening.

4. The rectifier assembly of claim 1 further including an addition plate at an end of said stack and having a central annular ridge defining an additional recess facing the other plates in said stack; and a disc-like resistor in said additional recess and in electrical contact with said additional plate and the adjacent plate in said stack.

5. The rectifier assembly of claim 1 further including annular seals fitted about each of said studs in sealing engagement with the associated stud and an adjacent annular ridge.

6. A semiconductor assembly comprising:

a generally tubular housing having an interior;

a series of plates formed of thermally and electrically conductive material within said housing in substantial abutment with said interior to form an aligned stack of said plates;

at least one face of some of said plates including a recess with other faces of others of said plates mounting studs directed toward an associated one of said recess.

a semiconductor wafer of a thickness slightly less than the depth of a recess within each said recess;

means for applying a compressive pressure to said stack to bring said plates, studs and wafers into good thermal and electrical contact; and electrical bus bars slidably extending through said stack about the periphery thereof and in electrical contact with predetermined ones of said plates and electrically isolated from predetermined others of said plates.

7. The rectifier assembly of claim 6 wherein said bus bars are located in angularly spaced, axially extending radially inwardly opening grooves in said tubular housing.

8. The rectifier assembly of claim 7 wherein said predetermined other plates are electrically isolated from certain of said bus bars by notches formed in their peripheries of a larger size and shape than the cross section of said certain bus bars.

9. A rectifier assembly adapted to be mounted in a generator rotor for rotation therewith about an axis comprising:

a generally tubular housing having an interior;

a series of plates formed of thermally and electrically conductive material within said housing and in substantial abutment with said interior to form an aligned stack of said plates;

the faces of said plates being configured to define diode wafer receiving pockets;

a diode wafer located within each said pockets;

means for applying a compressive pressure to said stack to bring said plates and said wafers into good thermal and electrical contact;

electrical conductors extending axially through said stack in electrical contact with predetermined ones of said elements and electrically isolated from predetermined others of said elements; and means for introducing a coolant into said housing generally on said axis and including a plurality of passages generally tangential to said axis and extending radially outwardly thereof oppositely of the intended direction of rotation about said axis.

10. The rectifier assembly of claim 9 wherein said plates, radially outwardly of said pockets, have axial holes through which coolant may flow from said introducing means through said stack.

11. The rectifier assembly of claim 10 wherein the holes in adjacent plates are generally non-aligned.

* * * * *